United States Patent
Seyyedy

[11] Patent Number: 5,923,682
[45] Date of Patent: Jul. 13, 1999

[54] ERROR CORRECTION CHIP FOR MEMORY APPLICATIONS

[75] Inventor: Mirmajid Seyyedy, Boise, Id.

[73] Assignee: Micron Technology, Inc., Boise, Id.

[21] Appl. No.: 08/790,463

[22] Filed: Jan. 29, 1997

Related U.S. Application Data

[51] Int. Cl.⁶ .................................................. G11C 29/00
[52] U.S. Cl. ...................................... 371/40.18; 371/40.4
[58] Field of Search ............................... 371/40.11, 40.2, 371/40.3, 40.4, 40.12, 40.18

[56] References Cited

U.S. PATENT DOCUMENTS

| | | | |
|---|---|---|---|
| 4,223,382 | 9/1980 | Thorsrud | 364/200 |
| 4,380,066 | 4/1983 | Spencer et al. | 371/10 |
| 4,453,248 | 6/1984 | Ryan | 371/11 |
| 4,458,349 | 7/1984 | Aichelmann, Jr. et al. | 371/13 |
| 4,479,214 | 10/1984 | Ryan | 371/11 |
| 4,608,687 | 8/1986 | Dutton | 371/10 |
| 4,888,773 | 12/1989 | Arlington et al. | 371/40.2 |
| 4,926,426 | 5/1990 | Scheuneman et al. | 371/40.1 |
| 5,199,033 | 3/1993 | McGeoch et al. | 371/10.1 |
| 5,363,484 | 11/1994 | Desnoyers et al. | 395/200 |
| 5,426,603 | 6/1995 | Nakamura et al. | 365/149 |
| 5,430,742 | 7/1995 | Jeddeloh et al. | 371/40.1 |
| 5,463,644 | 10/1995 | Rodi et al. | 371/40.4 |
| 5,468,681 | 11/1995 | Pasch | 437/183 |
| 5,481,552 | 1/1996 | Aldereguia et al. | 371/40.1 |
| 5,554,821 | 9/1996 | Patterson et al. | 174/52.2 |

OTHER PUBLICATIONS

Integrated Device Technology, Inc., "64–Bit Flow–Thru Error Detection and Correction Unit", Preliminary IDT49C466, Jun. 1991, pp. 1–11.

*Primary Examiner*—Stephen M. Baker
*Attorney, Agent, or Firm*—Schwegman, Lundberg Woessner and Kluth, P.A.

[57] ABSTRACT

A memory module, such as a SIMM or DIMM, is provided which incorporates error correction circuitry. The error correction circuitry identifies and corrects errors in communications between the memory module and an external processor. A reliable data processing system is also provided, incorporating the memory module comprising the error correction circuitry with a processor. The yield of manufactured chips is increased by presorting the memory chips which make up the memory module, such that a chip with one or more defective cells may be included in a memory module so long as no other chip has defective cells at the same location.

15 Claims, 3 Drawing Sheets

ERROR CORRECTION CHIP FOR MEMORY APPLICATIONS

FIELD OF THE INVENTION

The present invention relates in general to memory modules, and particularly to methods and apparatus for implementing error correcting code separate from the memory circuits in memory modules.

BACKGROUND OF THE INVENTION

Systems for storing and recalling information have been developed over the years in conjunction with the advances in computing technology. One of the primary considerations in architecting these memory systems is the ability to accurately read the incoming information and reproduce it correctly when writing it out again. Such electronically-represented information is comprised of a series of bits, each bit having a total of two possible states. It is recognized that a change in the value of a single bit can greatly affect the outcome of a mathematical operation or the meaning of the recorded information. Completely error-free transmission is as-of-yet unattainable. Data errors introduced during transmission, however, can be greatly reduced by the use of parity bits. Simply described, additional bits are added to the string of data bits in a predetermined pattern such that if an error is later introduced the error is detectable and often able to be corrected by logic at the receiving end. One of the better-known codes employed to provide such an error management system was developed by R. W. Hamming and is referred to as Hamming code. In its simplest form a message is divided into fixed-length blocks of bits where some of the bits are data bits and the rest of the bits are check bits which are set according to the Hamming code pattern. The ratio of data bits to check bits is such that in any one block any double-bit error can be detected and all single-bit errors are corrected.

There is a cost associated with the described error management process. The standard method of implementing such error correcting code in memories is to incorporate error correction code in the memory circuitry. This type of implementation results in a reduction in amount of memory available for data because of the increased overhead necessary to manage the check bits. For example, each thirty-two bit data word requires an additional seven bits to hold the verification code, necessitating a thirty-nine bit wide memory. Thus the commonly-used thirty-six bit wide single in-line memory module (SIMM) is not available to be used, although this is a conventional and popular size SIMM. In addition, SIMMS are typically created using memory modules that are four, eight, nine, sixteen, or eighteen bits wide. As a result the amount of memory required must be selected as multiples of these sizes. This may require extra memory space to store differently configured memory. This phenomenon was noted by Stanley Wolf, Ph.D. in *Silicon Processing for the VLSI Era* (1990). Wolf noted that the addition of parity bits imposed a memory area penalty, requiring up to 27% more memory cells to store the same amount of data.

Different approaches have been taken to address this limitation. One known method is to provide the additional space for the check bits, and accept the increased cost in non-standard SIMMS and reduced amount of area available for memory as a trade-off for reliable data. Other methods add circuitry to the memory device itself. An example of this method is shown in U.S. Pat. No. 5,481,552, entitled "Method and Structure for Providing Error Correction Code for 8-byte Data Words on SIMM Cards", and issued to Aldereguia et al. Aldereguia discloses a method of associating a system of latches with a memory such that the check bits for each data word are stored separately from the data bits. The system described by Aldereguia allows the conventional 36-bit SIMMS to be used, but doubles the number of memory reads or writes for each data access. U.S. Pat. No. 4,926,426, issued to Scheuneman et al. and entitled "Error Correction Check During Write Cycles", discloses another method of incorporating error correction code in memory devices. Scheuneman describes coupling an error checking and correction circuit with the output means within a dynamic random access memory such that errors may be detected during the read and write cycles. Both of these applications place additional circuitry within the already crowded memory device itself. There remains a need for an error correction system which does not impinge on the valuable real estate of a memory device and which has minimal impact on the speed of memory accesses.

SUMMARY OF THE INVENTION

The present invention teaches a method and apparatus for providing reliable communication between a processor and memory devices. What is provided is a memory module comprising a plurality of independently addressable memory devices, a communication path for bi-directional data communication between the driver unit and an external processor, and error correction circuitry electrically located between the driver unit and the communication path. According to one embodiment a driver unit is connected to the plurality of independently addressable memory devices and control signal inputs. In another embodiment the error correction circuitry is incorporated into the driver unit.

In one embodiment the memory module includes a circuit board to which the memory devices are affixed. Another embodiment of the present invention comprises a processor and a memory module comprising error correction circuitry. In a further embodiment the error correction circuitry detects errors in communications between the memory module and an external processor. In another embodiment the error correction circuitry corrects errors in communications between the memory module and an external processor.

According to one embodiment of the invention the plurality of memory devices comprise dynamic random access memories (DRAMs). In another embodiment the plurality of memory devices comprise static random access memories (SRAMs). One embodiment provides memories which are directly mounted on the printed circuit board and environmentally encapsulated. Another embodiment provides memories which are wire-bonded to a lead frame and then encapsulated in plastic, the packaged memory devices then being electrically connected to the circuit board.

Another feature provided by the present invention is chip yield enhancement. In one embodiment of the present invention, the memory devices are sorted before they are included in the memory module, such that there is zero correlation of failing bits among the memories in any one memory module. Also provided is a method of populating a memory module, the memory module having a plurality of independently addressable memory devices and error detection circuitry. The method comprises the steps of testing individual memories to determine locations of defective cells, selecting a plurality of the individual memories such that there is no coincidence of the locations of defective cells among the selected plurality of individual memories, and mounting the selected plurality of individual memories on the memory module such that the error detection circuitry is electrically located between the plurality of memories and an external processor. By this method and system less-than-perfect memory devices are productively used rather than having to be discarded.

A method of error-free communication with a memory module is also provided, the memory module comprising a plurality of independently addressable memories and error correction circuitry. This method comprises the steps of transmitting a write request message to a memory module from a processor, the message information comprising blocks of bit strings, receiving the message at the memory module, modifying the message by appending check bits to each of the blocks of bits, and multiplexing the modified message to the memories. Further steps of this method comprise a memory module receiving a read request from a processor, demultiplexing the requested message from the plurality of independently addressable memories, using the appended check bits to verify the requested message and to correct the message if an error has been introduced, and transmitting the verified message to the processor which issued the read request.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
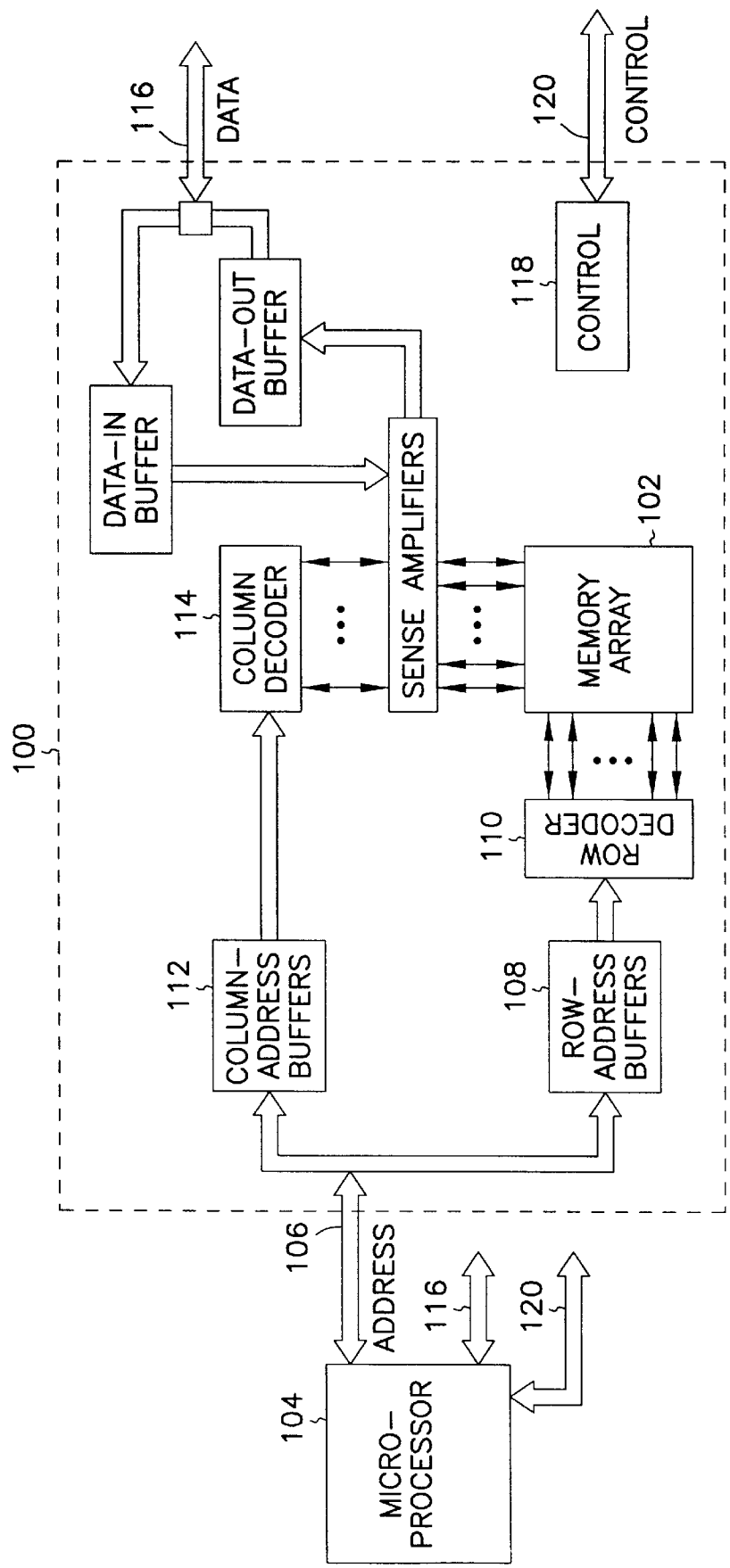
FIG. 1 is a block diagram of a system including a dynamic random access memory (DRAM)

Referring to FIG. 1, memory 100 is a dynamic random access memory (DRAM). DRAM 100 includes DRAM array 102 which can be accessed by microprocessor 104 through input/output communication paths including address lines 106. DRAM array 102 includes rows and columns of randomly addressable memory registers. DRAM 100 is accessed through address bus 106, data bus 116, and control bus 120. Control signals such as Row and Column Address Strobe signals RAS and CAS, Write Enable signal WE, an Output Enable signal OE, and other conventional control signals which are known to one skilled in the art are transmitted to DRAM 100 via control bus 120. Control logic 118 is used to control the many available functions of DRAM 100. Various control circuits and signals not detailed herein initiate and synchronize the DRAM operation as known to those skilled in the art. Row address latch/buffer 108 and row decoder 110 receive and decode a row address from a row address signal provided on address lines, and address a corresponding row of DRAM array 102. Likewise, column address latch/buffer 112 and column decoder 114 receive and decode a column address from a column address signal provided on address lines, and address the corresponding column of DRAM array 102. Data bus 116 receives memory register data during a write cycle from the microprocessor for writing to DRAM array 102. Data stored in DRAM 100 can be transferred during a read cycle on bus 116. Control logic 118 interprets WE to determine whether it is a read or write cycle. When WE is low it is a write cycle and when it is high it is a read cycle. As stated above, the DRAM description has been simplified for purposes of illustrating the present invention and is not intended to be a complete description of all the features of a DRAM. Other types of memories, such as static random access memory (SRAM), synchronous DRAM (SDRAM), video random access memory (VRAM), and EDO and BEDO DRAMs may also employ the method of the invention.

Figure 2:
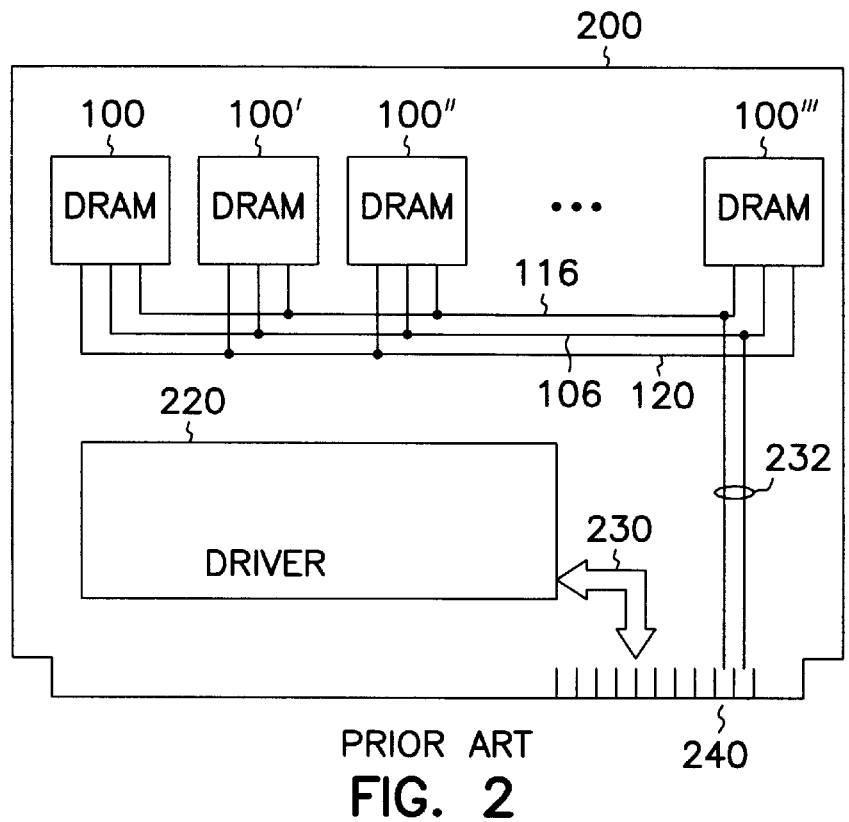
FIG. 2 is a block diagram of a prior art single in-line memory module (SIMM)

One means by which memory devices such as those described above are integrated into a computer system is through the use of single in-line memory modules (SIMMs). The basic structure of a SIMM is well-known in the art. One example of a conventional SIMM is shown in FIG. 2. A plurality of DRAM devices 100–100''' are mounted on a circuit board 200. Circuit board 200 embodies driver unit 220 through which the control bus 120 for each memory device is multiplexed. The drive circuit is needed to provide sufficiently strong control signals for all of the memory devices 100. A voltage regulator circuit can also be incorporated into the driver circuit or provided as a separate component. The plurality of memory devices 100–100''' embodied in the SIMM thus appear to and interact with the computer's central processing unit as a single memory module, and control information is transmitted to and from the SIMM via communication path 230 and pinouts 240. Data communication is performed using bi-directional data communication line 232. In one embodiment DRAM devices 100–100''' are integrated circuit chips which are mounted directly on circuit board 200 and environmentally encapsulated. In another embodiment DRAM devices 100–100''' are integrated circuit chips which are individually wire-bonded to a lead frame and encapsulated in plastic. The packaged DRAMS are then electrically connected to the circuit board using standard attachment techniques. It is to be recognized that other memory structures, such as DIMMs (dual in-line memory modules) or MCMs (multi-chip modules) may be employed in the same fashion.

A preferred embodiment of the present invention is a SIMM designed to fit into a standard memory socket, including JEDEC standard memory module pinouts and mechanical dimensions. It will be appreciated by those skilled in the art, however, that this package can be any configuration used in memory circuit and computer bus designs. The SIMM description addresses only the salient points of the architecture and is not intended as an in-depth description of all of the features of a SIMM. For the sake of illustration, only communication path 230 and a portion of the pinouts 240 are included in the figures. One skilled in the art, however, will recognize that there are a number of input/output lines on the memory module for communicating data, address, and control information between the memory module and the processor.

In the conventional memory module of FIG. 2, in order to ensure that a functional memory cell is being accessed, the architecture must include either redundancy or error management processing external to the memory module. This adds expense in both processing time and manufacturing costs. The need for a means to verify and correct communications with memory devices results from the unavoidable fact that memory devices will have defects. Memory devices are typically manufactured with redundant circuits which can be programmed to replace defective cells after exhaustive testing is conducted to identify which cells on a memory chip has failed. The redundant cells are activated through the use of fuse and anti-fuse circuits. It will be appreciated that as the memory cell density is increased, more redundant cells are needed. As known to those skilled in the art, an anti-fuse is a normally open circuit which is shorted when programmed. A popular type of anti-fuse is a capacitor fabricated similar to a DRAM memory cell. The current oxide-nitride-oxide (ONO) dielectric used in DRAM memory cell capacitors is ideal for anti-fuse fabrication. Anti-fuse fabrication is complicated, however, as a result the trend toward manufacturing DRAMs with a barium-strontium-titanium (BST) dielectric between the memory cell capacitor plates rather than the conventional ONO dielectric.

Figure 3:
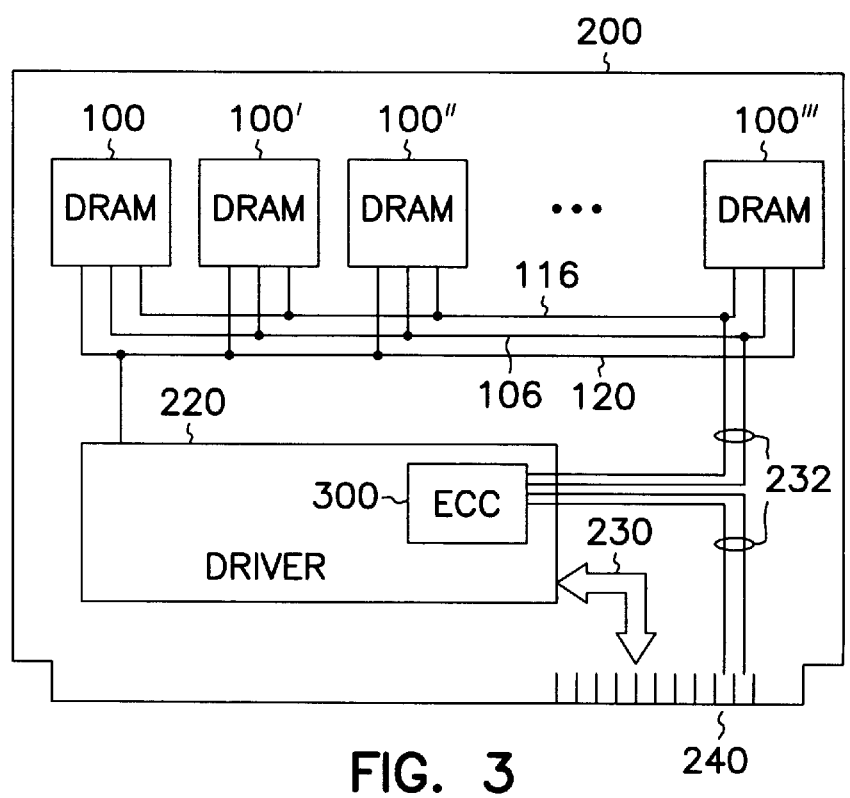
FIG. 3 is a block diagram of a single in-line memory module (SIMM) according to one embodiment of the present invention.

The expense of manufacturing high density memory devices which have no memory cell defects will increase and the manufacturing yield decreases. The system of the present invention solves this problem by integrating error correction technology into a memory module, complementing on-chip redundancy. FIG. 3 shows a preferred embodiment of the present invention. To eliminate the need for an additional component, error correction circuitry 300 is incorporated into a common package with driver unit 220. The error correction circuitry 300, described in more detail below, comprises circuitry for identifying and correcting data message transmission errors. Locating error correction circuitry 300 at the point of message transmission into or out of memory module 200 provides error-free output even when the memory devices 100 do not have all memory cells functional.

The present invention effectively increases the manufacturing yield of the memory devices by allowing the use of less-than-perfect chips. That is, the error correction circuit allows the use of normally defective memory devices. This is accomplished by pre-sorting the memory chips before installing them on a memory module such that there is zero correlation of failing cells among the memories of a memory module. During testing redundant cells can be used to correct defective memory cells. However, if there are more defects than available redundant cells the address locations of remaining defective cells are recorded. The addresses of failing cells on each chip can then be compared to find the best groupings for a memory module 200. As a result, memory devices which would normally be considered defective can be used.

The error correction circuitry 300 can be provided as a separate packaged component. In this embodiment, the error correction circuitry is electrically incorporated into the circuitry of memory module 200 between the plug interface 240 and the memory devices such that data communication lines 116 pass through the error correction circuitry. The error correction circuit uses the data control signals to identify when data is being written to the memories, or data is being read from the memories. Thus, WE* can be used by the error correction circuit to identify the direction of data transmission.

The error correction circuitry preferably serves as an interface between a memory module 200 and a central processing unit 104. In another embodiment, error correction circuitry can be used as an interface between two memory modules. With a memory module incorporating error correction circuitry, outgoing messages comprising blocks of bits are corrected and are transmitted error-free. Data messages coming into the memory module are processed through the error correction circuitry and check bits are generated and appended before each message is transmitted to the DRAMs. Check bits are employed by the error correction circuitry to ensure accuracy of the message when it is subsequently transmitted out of memory. The error correction circuitry is designed to have propagation delays of less than a few nanoseconds so the impact on overall processing speed is minimal.

Figure 4:
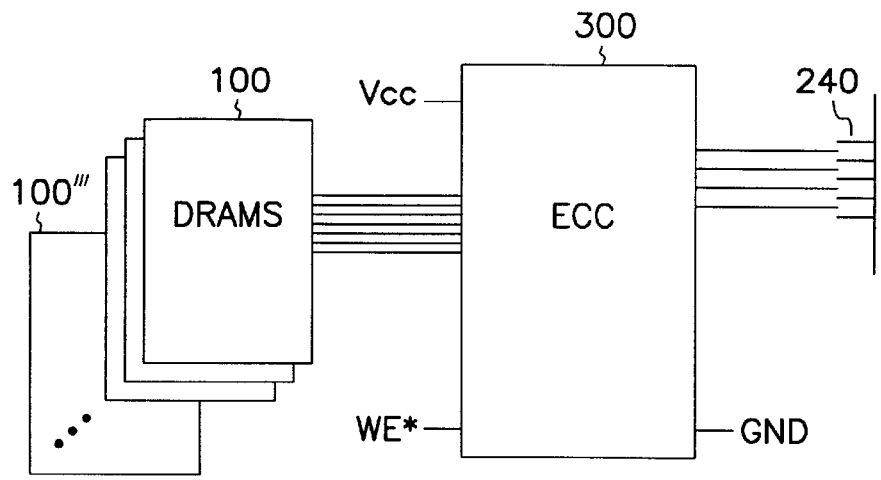
FIG. 4 is a block diagram of error correction circuitry.

FIG. 4 shows further detail of error correction circuitry 300. There are a variety of error correction algorithms, including parity checking, Hamming codes, and Reed-Solomon codes. Error correction algorithms are limited in the number of errors that they can detect or correct. As an example, a Hamming code can only detect two errors and correct one. Embodying the circuitry in a single location external to the DRAMS but through which all DRAMs are connected reduces redundant circuitry and frees up valuable real estate within the DRAMs. Incorporating the error correction circuitry on the memory module itself provides an essentially error-free memory module without requiring specialized input/output processing.

Error correction circuitry 300 of FIG. 4 preferably corrects data transmissions using a Hamming code. Thus, each seven bit word transmitted from error correction circuit 300 to memory devices 100 comprises four message bits and three check bits appended by the error correction circuitry 300 to correct the four message bits. Appending check bits increases the overhead associated with memory use, but the trend toward wider bandwidth memory boards minimizes the impact of the increased overhead. During a read operation, error communication circuitry 300 strips off the check bits as part of the process of verifying the message bits for out-going messages. Therefore, messages transmitted between the memory module and the 'outside world' (whether it be another memory device, the central processing unit, or some other circuitry) comprise four bit packages. It will be appreciated that circuitry employing other known error correction methods, such as parity checking or Reed-Solomon codes, may alternatively be used with the present invention.

Figure 5:
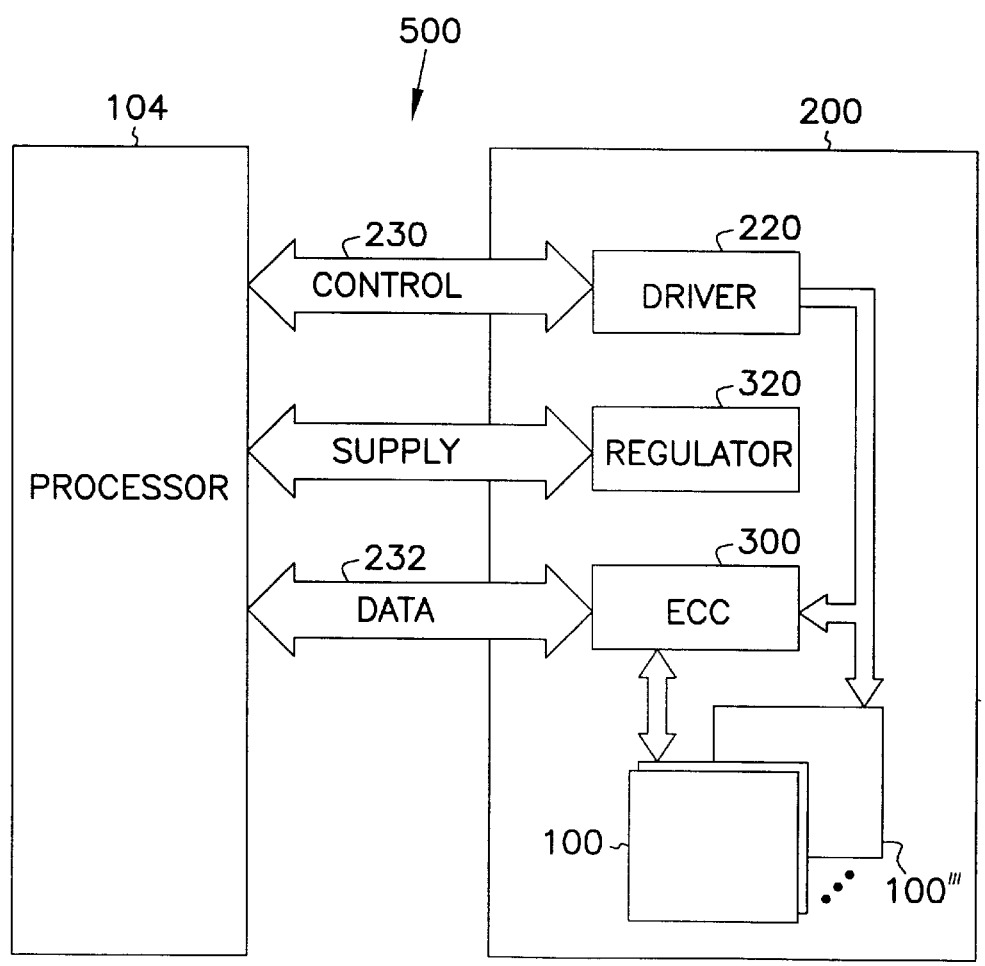
FIG. 5 is a block diagram of a data processing system according to one embodiment of the present invention.

FIG. 5 illustrates an example of a data processing system incorporating the present invention. Processor 104 is coupled to one or more memory modules 200. In one embodiment processor 104 is a 100 MHz Pentium® processor. Memory module 200 comprises one or more memory devices 100, driver unit 220, an optional voltage regulator 320, and error correction circuitry 300. Processor 104 exchanges control information via control lines 230 and data via bi-directional data communication path 232. Driver unit 220 is situated between processor 104 and memory devices 100, performing such tasks as multiplexing and demultiplexing control messages. Error correction circuitry 300 verifies and corrects data messages coming into or being sent from memory module 200. As stated above, driver unit 220, voltage regulator 320, and error correction circuitry 300 can be incorporated into a common integrated circuit package for a simplified memory module.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory module comprising:

a plurality of independently addressable memory devices;

a communication path for bi-directional data communication between the plurality of independently addressable memory modules and an external circuit; and error correction circuitry electrically located between the plurality of independently addressable memory devices and the communication path, the error correction circuitry operating according to an error correction process, wherein the memory devices are sorted before they are included in the memory module, such that there is zero correlation of failing memory cells among the memory devices in any one memory module.

2. The memory module of claim 1 further comprising a driver unit connected to the plurality of independently addressable memory devices and control signal inputs.

3. The memory module of claim 2 wherein the error correction circuitry is incorporated into the driver unit.

4. The memory module of claim 1 wherein the error correction process employs a Hamming code to detect errors in data message transmissions.

5. The memory module of claim 1 further comprising a circuit board wherein the plurality of independently addressable memory devices are affixed to the circuit board.

6. The memory module of claim 1 wherein the plurality of independently addressable memory devices comprise dynamic random access memories (DRAMs).

7. A data processing system comprising:

a processor; and a memory module comprising:

a plurality of independently addressable memory devices;

a communication path for bi-directional data communication between the plurality of independently addressable memory modules and an external circuit; and error correction circuitry electrically located between the plurality of independently addressable memory devices and the communication path, the error correction circuitry operating according to an error correction process, wherein the memory devices are sorted before they are included in the memory module, such that there is zero correlation of failing data bits among the memory devices within any one memory module.

8. The data processing system of claim 7 further comprising a driver unit connected to the plurality of independently addressable memory devices and control signal inputs.

9. The data processing system of claim 8 wherein the error correction circuitry is incorporated into the driver unit.

10. The data processing system of claim 7 further comprising a circuit board wherein the plurality of independently addressable memory devices are affixed to the circuit board.

11. The data processing system of claim 7 wherein the plurality of independently addressable memory devices comprise dynamic random access memories (DRAMs).

12. The memory module of claim 7 wherein the error correction process employs a Hamming code to detect errors in data message transmissions.

13. A method of populating a memory module, the memory module having a plurality of independently addressable memory devices and error detection circuitry, comprising the steps of:

testing individual memories to determine locations of defective memory cells;

selecting a plurality of the individual memories such that there is zero correlation of failing memory cells among the selected plurality of individual memories; and mounting the selected plurality of individual memories on the memory module such that the error detection circuitry is electrically located between the plurality of memories and an external circuit.

14. A method of error-free communication with a memory module, the memory module comprising a plurality of independently addressable memories and error correction circuitry, the memory module having zero correlation of failing data bits among the memories within the memory module, the method comprising the steps of:

writing a data message to the memory module from an external processor, the data message comprising blocks of data bits;

receiving the data message at the memory module;

modifying the data message using the error correction circuitry by appending check bits to each of the blocks of data bits; and multiplexing the modified data message to the plurality of independently addressable memories using control circuitry provided by the memory module.

15. The method of claim 14, further comprising the steps of:

requesting data from the memory module using the external processor;

demultiplexing the requested data from the plurality of independently addressable memories using control circuitry provided by the memory module;

verifying the requested data message using the error correction circuitry and the appended check bits;

correcting any errors in the data message; and transmitting the verified data message to the external processor.

* * * * *